United States Patent
Farooq et al.

(10) Patent No.: US 9,824,925 B2
(45) Date of Patent: Nov. 21, 2017

(54) FLIP CHIP ALIGNMENT MARK EXPOSING METHOD ENABLING WAFER LEVEL UNDERFILL

(71) Applicant: International Business Machines Corporation, Armonk, NY (US)

(72) Inventors: Mukta G. Farooq, Hopewell Junction, NY (US); Kevin S. Petrarca, Newburgh, NY (US); Nicholas A. Polomoff, White Plains, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 14/736,608

(22) Filed: Jun. 11, 2015

(65) Prior Publication Data

US 2016/0365281 A1    Dec. 15, 2016

(51) Int. Cl.
*H01L 21/78* (2006.01)
*H01L 21/56* (2006.01)
*H01L 21/60* (2006.01)

(52) U.S. Cl.
CPC ............ *H01L 21/78* (2013.01); *H01L 21/563* (2013.01); *H01L 2021/6009* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,225,704 B1 * | 5/2001 | Sumita | ............ | H01L 21/563 257/778 |
| 8,994,173 B2 | 3/2015 | Daubenspeck et al. | | |
| 2005/0206679 A1 * | 9/2005 | Rivas | ............ | B41J 2/1404 347/44 |
| 2007/0072193 A1 * | 3/2007 | Shah | ............ | B01J 19/0046 435/6.11 |
| 2009/0102070 A1 * | 4/2009 | Feger | ............ | H01L 21/563 257/797 |
| 2009/0108472 A1 | 4/2009 | Feger et al. | | |
| 2014/0027885 A1 | 1/2014 | Kawase et al. | | |

OTHER PUBLICATIONS

Nah et al., "Development of Wafer Level Underfill Materials and Assembly Processes for Fine Pitch Pb-free Solder Flip Chip Packaging," 2011 Electronic Components and Technology Conference, pp. 1015-1022.
Katsurayama et al., "High Performance Wafer Level Underfill Material with High Filler Loading," 2011 Electronic Components and Technology Conference, pp. 370-374.

* cited by examiner

*Primary Examiner* — Kyoung Lee
*Assistant Examiner* — Ratisha Mehta
(74) *Attorney, Agent, or Firm* — Steven J. Meyers; Hoffman Warnick LLC

(57) ABSTRACT

Alignment marks on a semiconductor device surface are exposed and exposed surfaces cleaned after an obscuring coating is applied over the surface and marks. The surface can be an attachment surface of the device and can include C4 solder bumps of a flip-chip type device and the coating can include a wafer level underfill coating that is substantially optically opaque. Laser ablation, such as with a UV laser, can remove the coating while minimizing heat transfer to the device.

20 Claims, 6 Drawing Sheets

FLIP CHIP ALIGNMENT MARK EXPOSING METHOD ENABLING WAFER LEVEL UNDERFILL

BACKGROUND

The invention relates generally to semiconductor structures and fabrication of semiconductor chips and, in particular, to methods of enabling use of substantially optically opaque wafer level underfill applied in flip chip techniques and apparatus therefor, such as the use of solder bump connections fabricated during back-end-of-line (BEOL) processing of semiconductor chips.

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components.

Fabrication foundries ("fabs") manufacture ICs based on design layouts using a photolithographic process. Photolithography is an optical printing and fabrication process by which patterns on a photolithographic mask (i.e., photomask) are imaged and defined onto a photosensitive layer coating a substrate. The photomasks contain the various geometries (i.e., features) of the IC design layout. The various geometries contained on the photomasks correspond to the various base physical IC elements that comprise functional circuit components such as transistors, interconnect wiring, and via pads, as well as other elements that are not functional circuit elements, but that are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

These photolithographic processes are typically regarded as front-end-of-line (FEOL) processing yielding a chip or die including multiple ICs. The addition of metallization levels and formation of an interconnect structure are said to be produced by back-end-of line (BEOL) processing. In flip-chip type fabrication, solder bumps are formed on a surface of the chips, which are then packaged and mounted on a circuit board that includes attachment pads, such as in the case of 3D integration and/or silicon chip to silicon chip bonding, but which can also include corresponding solder bumps to connect to those of the chips, such as in the case of chip-to-laminate-substrate bonding, in which case the bumps are referred to as "pre-solder bumps." Solder bumps are thus utilized to provide mechanical and electrical connections between the last or top metallization level and the circuit board.

A common type of solder bump is the controlled collapse chip connection (C4) solder bump. Controlled collapse chip connection (C4) processes are well known in forming solder bumps in semiconductor fabrication. During assembly of the chip and circuit board, C4 solder bumps establish physical attachment and electrical contact between an array of C4 pads on the chip and a complementary array of C4 pads on the circuit board.

Figure 1:
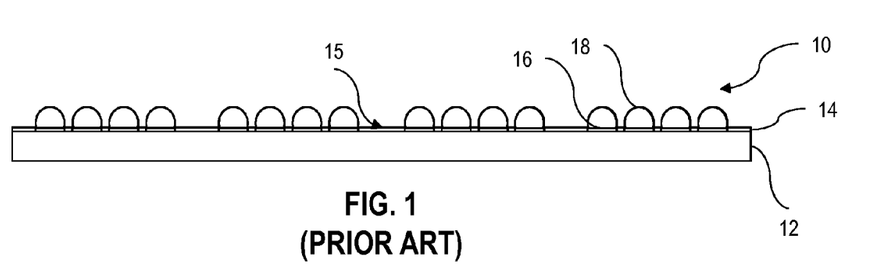
FIG. 1 is a schematic side view illustration of a typical prior art die that can be prepared according to embodiments of the invention disclosed herein.
Figure 2:
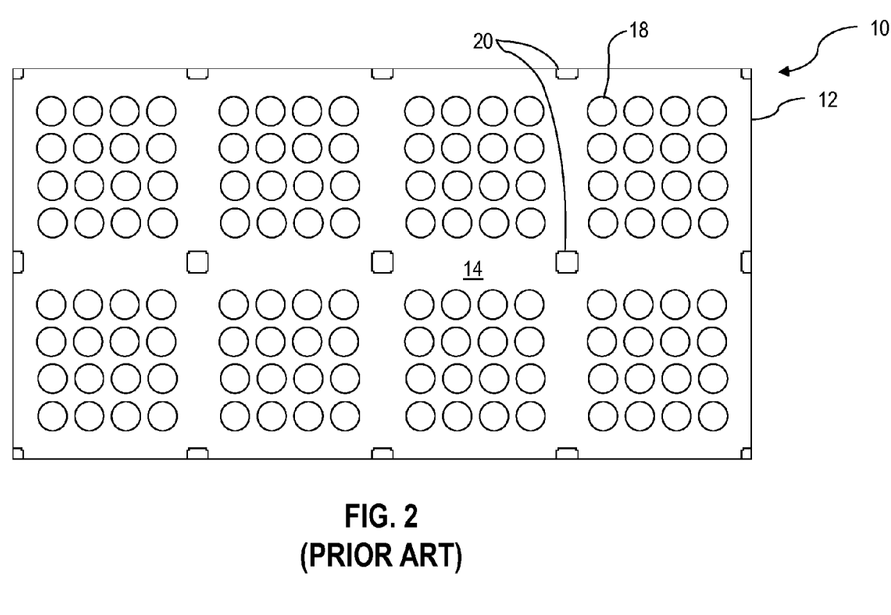
FIG. 2 is a schematic top view illustration of the typical prior art die shown in FIG. 1 according to embodiments of the invention disclosed herein.

Referring to FIGS. 1 and 2, a die of semiconductor devices is shown as might be produced in conventional solder bump fabrication processes, particularly those employing C4 and/or standard plug final via processes. As shown, a die 10 can include a device layer 12, an attachment layer 14, connection pads 16, and solder bumps 18 formed and/or applied by known techniques, such as C4 fabrication processes. In addition, alignment marks 20 can be applied to an attachment surface 15 of die 10, which can also be formed and/or applied using known techniques. It should be understood that attachment layer 14 can typically include a passivation layer, but could instead be some other type of material layer, or that additional layers can be applied over device layer 12 and/or attachment layer 14. For example, attachment layer 14 can include an electrically conductive protective layer using techniques disclosed in U.S. Pat. No. 8,994,173 to Daubenspeck et al., the disclosure of which is incorporated by reference. Still further, die 10 can be formed by any number of known processes and materials used in semiconductor device fabrication, all of which are well known in the art and to those of ordinary skill therein. The specific processes and materials used to form die 10 are not necessarily of import to embodiments of the invention disclosed herein beyond knowledge of material properties of device layer 12, attachment layer 14, pads 16, and solder bumps 18, so that appropriate wafer-level underfill (WLUF) coating material and/or filler can be selected. For example, a typical passivation layer can include polyimide in various incarnations, some photoresponsive and some non-photoresponsive, all of whose properties are well known in the art. In addition, solder bump composition and properties thereof are well known, as are the compositions and properties of a wide variety of other materials that can be used in attachment layer 14.

Top surface 15 of attachment layer 14 is typically left exposed after formation of a solder bump 18, and so is a contact surface during packaging of a semiconductor device in which the passivation layer is included. For example, a typical plug via process can produce a solder bump connected to a metal line by a copper-filled via. The via is formed in attachment layer 14, such as in a final passivation layer, a top surface of the passivation layer, such as surface 15, being exposed after formation of the solder bump. The materials typically used to form a passivation layer, such as a polyimide (PI), tend to be relatively soft, in some cases even gelatinous, and hence more susceptible to damage than dielectric and/or conductor layers. Thus, as shown in FIG. 1, top surface 15 can be damaged during processing and/or fabrication, such as by a pad used in chemical mechanical polishing (CMP) to remove excess copper (Cu) after filling the via and/or to remove material of other layers. For example, a pad used in the CMP process can scratch or abrade the surface of the passivation layer, embed copper or other materials in the passivation layer, introduce discontinuities at the edge of the via, create cavities in the surface, and/or otherwise create defects in areas of the passivation layer where most or all of the copper has been removed.

Such passivation layer damage can reduce reliability of a semiconductor device packaging interface, and so processes have been employed to recondition the surface of the passivation layer, such as wet cleans and plasma treatments, which can be expensive and time consuming. The resulting reconditioned surface of the passivation layer, while far better than a surface without reconditioning, is still not as desirable as the initial, undamaged passivation layer surface prior to CMP. In addition, exposed surfaces can degrade between completion of the solder bumps and passivation layer and the time at which attachment is performed, such as by oxidation and/or other chemical processes, which can adversely affect the electrical and/or mechanical connections produced during the attachment process.

To reduce such damage and other adverse effects, some fabrication processes employ coatings applied over the passivation layer and solder attachment surfaces. For example, a so-called wafer-level underfill (WLUF) layer can be applied to protect exposed surfaces of chips prior to attachment, though other coatings and/or processes are used in fabs, such as reflow/capillary and differential heating/cooling. However, WLUF has significant advantages over some other processes, such as reducing mismatch of coefficient of thermal expansion (CTE) of materials, reducing stress during assembly, and eliminating flux residue cleaning, baking, plasma bombardment, and other steps that can add cost and complexity to fabrication, packaging, and attachment. Even so, some WLUF coating materials present a challenge relative to attachment in that an alignment mark ordinarily visible on the attachment surface, such as on or through the passivation layer, become obscured by the WLUF coating. For example, to provide better CTE matching, a filler can be included in the WLUF material that can render the WLUF coating substantially optically opaque, or at least render discernment of the alignment marks difficult.

SUMMARY

An embodiment of the invention disclosed herein may include a method in which a portion of a substantially optically opaque coating can be selected to be removed from an attachment surface of a semiconductor device that carries at least one feature obscured by the substantially optically opaque coating, the obscuring of the at least one feature hindering processing of the semiconductor device. The selected portion can then be removed, such as by laser ablation, to expose a portion of the semiconductor device attachment surface including the at least one feature. The exposed portion of the semiconductor device and a surrounding surface of the coating can then be cleaned in preparation for subsequent fabrication steps.

Another embodiment of the invention disclosed herein can take the form of a preparation method for a semiconductor device having an attachment surface that carries a plurality of solder bumps and at least one attachment alignment mark, the attachment surface being coated with a substantially optically opaque coating material that obscures the at least one attachment alignment mark. A portion of the coating material overlying an attachment alignment mark can be selected and removed, such as by using laser ablation. Removing the selected portion of the coating material can expose the respective alignment mark and a respective portion of the attachment surface. The respective portion of the attachment surface and a surrounding surface of the coating material can then be cleaned.

A further embodiment of the invention disclosed herein can take the form of a method including applying a wafer level underfill (WLUF) coating to an attachment surface of a semiconductor device article. The attachment surface can include a plurality of solder bumps and a plurality of alignment marks, and the coating can have a thickness extending beyond an end of a furthest projecting solder bump. The coating thus can obscure the plurality of alignment marks. By selecting portions of the WLUF coating corresponding to the obscured plurality of alignment marks, the selected portions of the WLUF coating can be ablated or removed with a laser ablation system, thereby exposing the obscured plurality of alignment marks. The exposed alignment marks and surrounding portions of the attachment surface and the WLUF coating can then be cleaned to.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

DETAILED DESCRIPTION

Embodiments of the present invention are directed to a technique that can be used to enable wafer level underfill (WLUF) coating use in semiconductor device fabrication, particularly for finer photolithography processes producing smaller scale elements, such as, for example, in multiple patterning lithography technology, though the advantages of embodiments can be enjoyed in more conventional current fabrication processes, as well. While embodiments may be described with respect to attachment using solder bumps in flip-chip techniques, embodiments may additionally be used with other attachment techniques. Likewise, while embodiments are described primarily with reference to WLUF coatings, embodiments can be employed with other attachment mark obscuring coatings and/or processes. As is known, a die including multiple chips is typically diced prior to attachment. Embodiments of the invention disclosed herein can be applied before or after dicing as may be suitable, desirable, and/or appropriate. Further, embodiments can be used in conjunction with known WLUF techniques, such as that disclosed in U.S. Patent Application Publication No. 2009/0108472 to Feger et al., the disclosure of which is incorporated by reference.

Returning to FIGS. 1 and 2, a die 10 including a device layer 12, an attachment layer 14, connection pads 16, and solder bumps 18 can be fabricated by known techniques, such as C4 fabrication processes. In addition, alignment marks 20 can be applied to an attachment surface 15 of die 10, which can also be formed and/or applied using known techniques. As noted above, it should be understood that attachment layer 14 can typically include a passivation layer, but could instead be some other type of material layer, or that additional layers can be applied over device layer 12 and/or attachment layer 14 within the scope of embodiments. For example, attachment layer 14 can include an electrically conductive protective layer using techniques disclosed in U.S. Pat. No. 8,994,173 to Daubenspeck et al., the disclosure of which is incorporated by reference. Still further, die 10 can be formed by any number of known processes and materials used in semiconductor device fabrication, all of which are well known in the art and to those of ordinary skill therein. The specific processes and materials used to form die 10 are not necessarily of import to embodiments of the invention disclosed herein beyond knowledge of material properties of device layer 12, attachment layer 14, pads 16, and solder bumps 18, so that appropriate WLUF coating material and/or filler can be selected. For example, a typical passivation layer can include polyimide in various incarnations, some photoresponsive and some non-photoresponsive, all of whose properties are well known in the art. In addition, solder bump composition and properties thereof are well known, as are the compositions and properties of a wide variety of other materials that can be used in attachment layer 14. Further, embodiments can be incorporated into existing fabrication processes as steps between completion of bump formation and chip attachment, before and/or after dicing of the die into individual chips.

Figure 3:
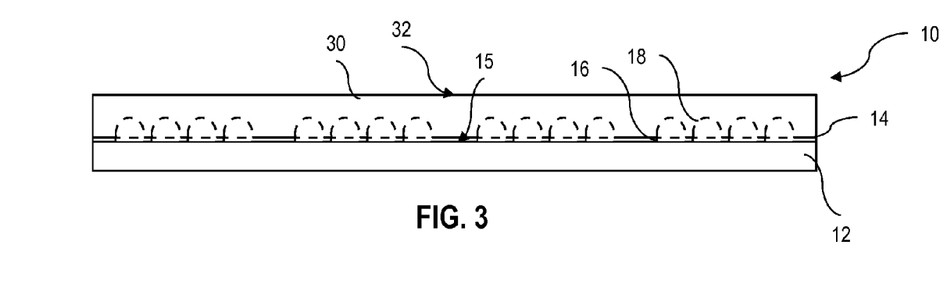
FIG. 3 is a schematic side view illustration of a die with a coating applied according to embodiments of the invention disclosed herein.
Figure 4:
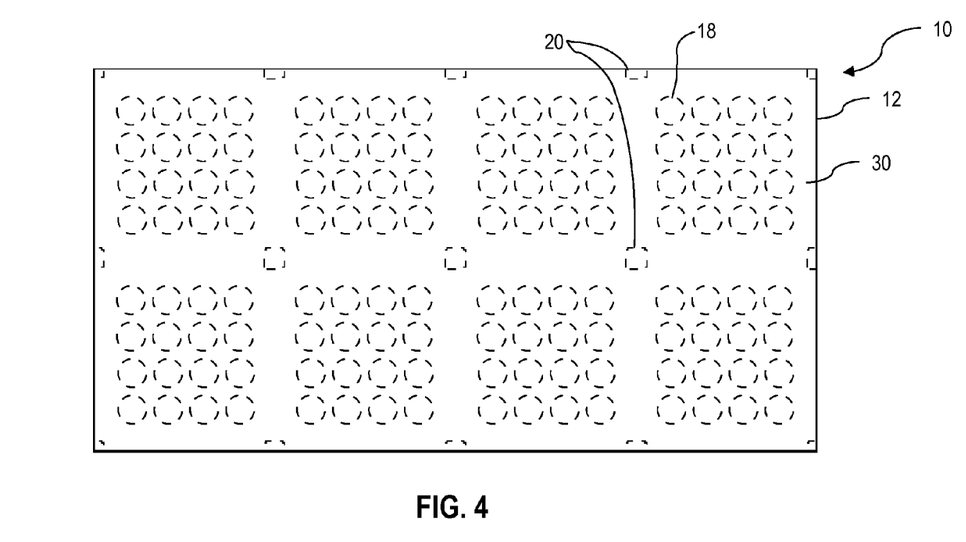
FIG. 4 is a schematic top view illustration of the die shown in FIG. 3 with a coating applied according to embodiments of the invention disclosed herein.

With reference to FIGS. 3 and 4, embodiments include applying a coating 30 over attachment surface 15 and solder bumps 18, covering alignment marks 20 and presenting a coating surface 32 used in attachment, as will be described. Coating 30 can include a wafer level underfill (WLUF) coating, such as a resin, though other materials can be used. For example, a B-staged resin could be employed, which could be a thermally setting resin. If needed, suitable, and/or desirable, WLUF coating 30 can include a filler or other modifying material to alter its thermal and/or chemical properties. For example, WLUF coating 30 can include a silica filler to reduce a coefficient of thermal expansion (CTE) of the WLUF coating to reduce stresses induced during attachment as well be described. Where a thermally setting resin is used, die 10 can be placed in an environment in which temperature can be controlled, such as to maintain temperature of the WLUF coating at a cure temperature for a required cure period.

Depending on the particular WLUF coating material and/or filler(s) employed, alignment marks 20 may be partially or completely obscured from view by machinery used in flip chip attachment processes. To allow use of WLUF materials with such optical properties, such as partially or substantially optically opaque materials, embodiments provide a way to expose one or more of alignment marks 20 to allow such machinery to detect marks 20. Broadly, a portion of WLUF coating 30 can be selected for removal, the selected portion can be removed, and any exposed surface(s) and/or surrounding surface(s) can be cleaned. While it is possible the removal could be performed such that soot or other materials does not form on exposed and/or surrounding surface(s), cleaning should still be performed since very slight changes in conditions during removal could result in unexpected deposition of such materials, which could adversely affect attachment, electrical connections, and/or mechanical connections of the final chip(s) and/or semiconductor device(s). Again, while the example described shows selection, removal, and cleaning occurring before dicing, it should be readily apparent that these steps can be performed on singulated chips 60 (FIGS. 8-10) after dicing if so desired and/or appropriate.

Figures 5, 6:
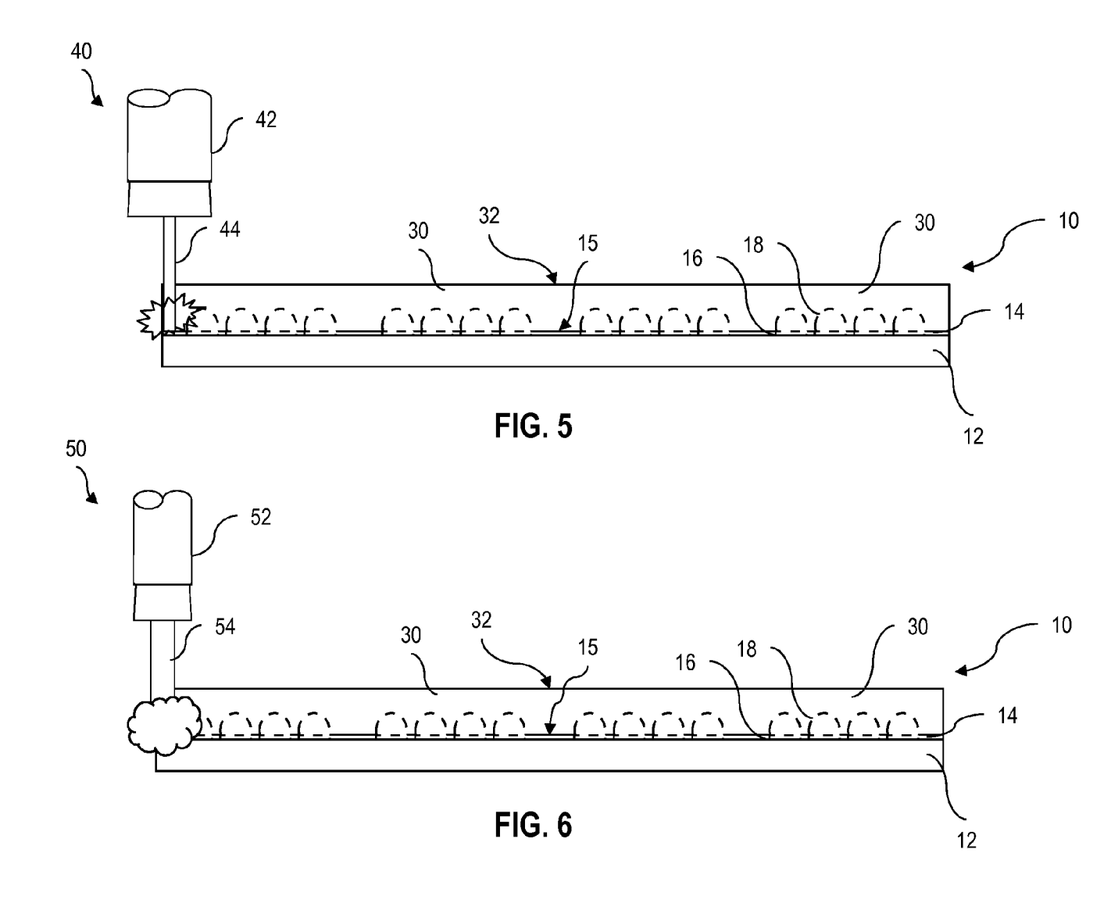
FIG. 5 is a schematic side view illustration of a selected portion of a coating on a die being removed according to embodiments of the invention disclosed herein.
FIG. 6 is a schematic side view illustration of exposed surfaces and/or regions surrounding a removal area being cleaned according to embodiments of the invention disclosed herein.

Turning now to FIG. 5, a portion of WLUF coating 30 can be selected for removal, and the selected portion can be removed. In the example shown in FIG. 5, a laser ablation system 40 can be used to remove the selected portion of WLUF coating 30. Such a laser ablation system 40 can include a laser 42 that can produce radiation 44 targeted at the selected portion of WLUF coating 30. For example, laser 42 can take the form of an excimer laser producing ultraviolet radiation in pulses of a particular fluence to ablate WLUF coating material with a low transfer of heat to surrounding materials. In embodiments, another type of laser could be employed and/or other wavelengths of radiation, fluences, pulse duration/frequency, and/or other aspects of laser ablation can be varied. For example, a gas discharge laser, semiconductor laser, or other type of laser could be used, or a maser or other type of device producing coherent radiation could be used so long as the selected portion of WLUF coating 30 can be ablated with relatively little heat transfer to surrounding material(s) of die 10. In the particular example shown, a laser producing coherent radiation at a wavelength of from about 100 nm to about 400 nm at a fluence of from about 200 mJ/cm$^2$ to about 2000 mJ/cm$^2$ when in pulses at a frequency of from about 100 Hz to about 800 Hz. For many B-stage resins with silica filler(s), radiation at a wavelength of from about 250 nm to about 350 nm at a fluence of from about 200 mJ/cm$^2$ to about 1000 mJ/cm$^2$ when in pulses at a frequency of from about 100 Hz to about 500 Hz can be employed. As used herein, "about" indicates +/−10% change in the value stated. In one embodiment, satisfactory efficacy was observed using a wavelength of about 308 nm at a fluence of about 500 mJ/cm2 in about 500 pulses at a pulse frequency of about 200 Hz.

Continuing now to FIG. 6, a cleaning station 50 can be used to clean any exposed surface(s) and/or surrounding area(s) after removal of the selected portion of WLUF coating 30. For example, a water jet system can include a nozzle or the like 52 that can direct a water jet 54 at exposed surface(s) and/or surrounding area(s) after removal. It should be apparent, however, that any suitable cleaning station and/or system could be employed, and using a cleaning station and/or system already present and used in a semiconductor fabrication process presents cost and efficiency improvement opportunities.

Figure 7:
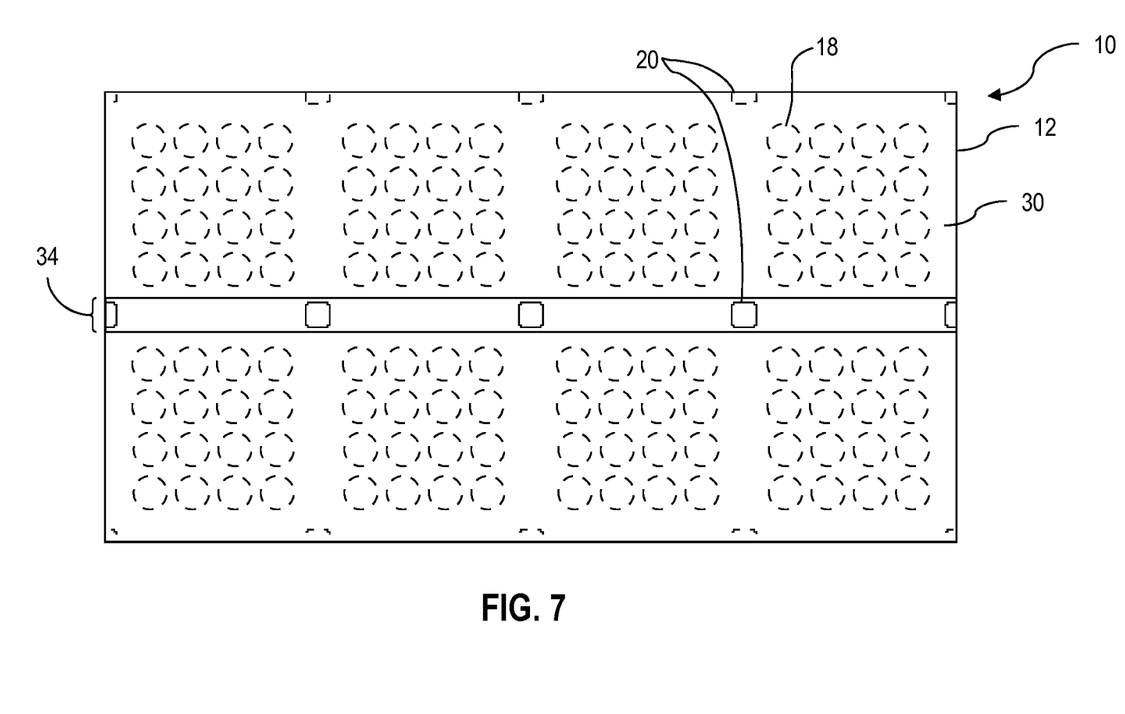
FIG. 7 is a schematic top view illustration of a coated die with a portion of the coating removed according to an embodiment of the invention disclosed herein.

As illustrated in FIG. 7, a groove or the like 34 can be formed by the removal process, exposing one or more alignment marks 20 on attachment surface 15, possibly also exposing one or more of solder bumps 18, depending on the particular orientation and/or path of removal, as well as the shape and/or location of the portion of WLUF coating 30 selected for removal.

Figure 8:
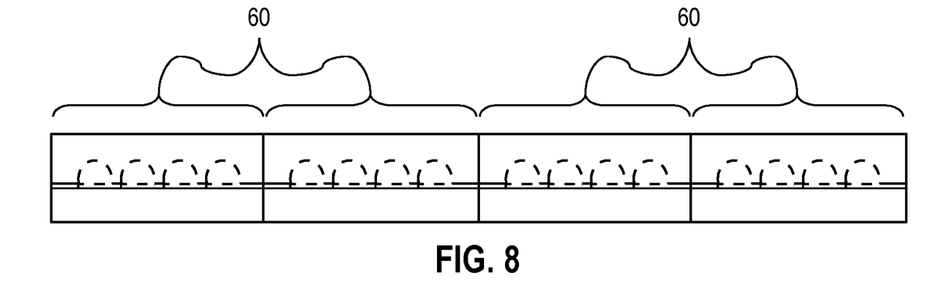
FIG. 8 is a schematic illustration of dicing a die in accordance with aspects of embodiments of the invention disclosed herein.
Figure 9:
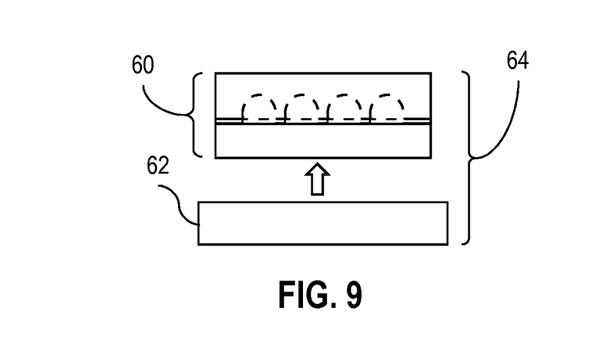
FIGS. 9 and 10 are schematic illustrations of preparing a singulated chip for attachment to a substrate according to embodiments of the invention disclosed herein.
Figure 10:
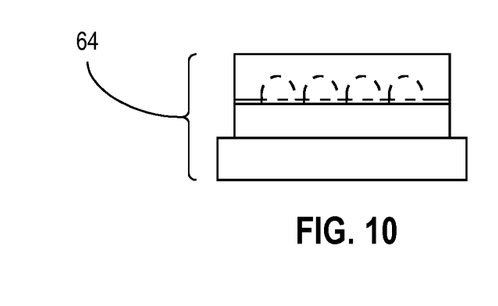
Figure 11:
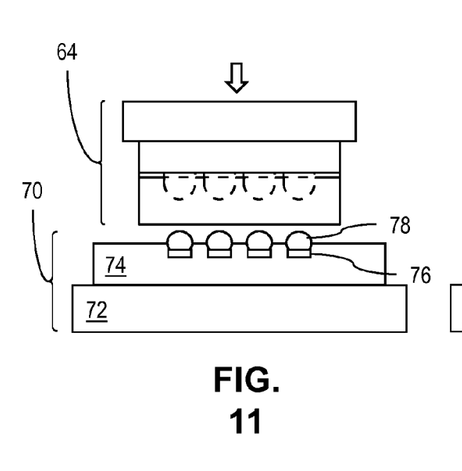
FIGS. 11-15 schematically illustrate an attachment process used with dies to which embodiments of the invention disclosed herein have been applied.
Figures 12, 13:
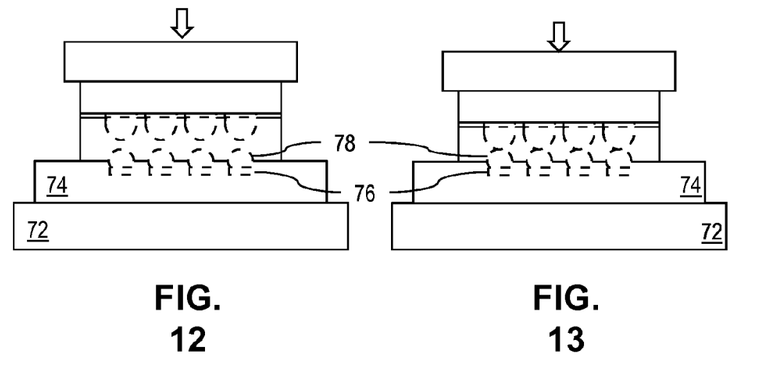
Figure 14:
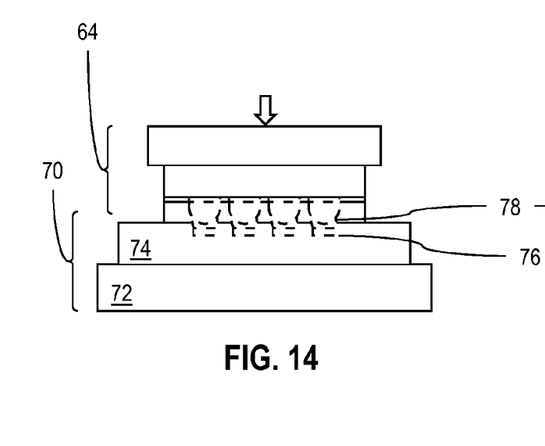
Figure 15:
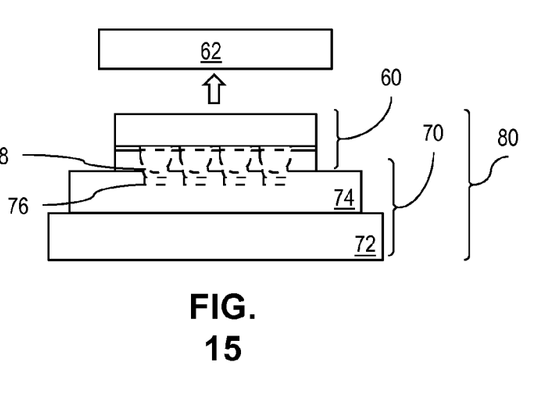

Fabrication can continue by dicing die 10 into singulated chips 60, as shown in FIG. 8, which can be attached to a bonder head 62 (FIG. 9) as shown in FIGS. 9 and 10, yielding an attachment article 64. As shown in FIG. 11, attachment article 64 can then be presented with coating surface 32 (FIG. 5) facing an attachment assembly 70 including a base plate 72 supporting a substrate 74, at which point force can be applied to attachment article 64 and/or attachment assembly 70 to bias WLUF coating 30 (FIG. 5) toward substrate 74. Substrate 74 can include pads 76 to which solder bumps 18 (FIG. 5) can be joined, pads 76 corresponding in number and location to solder bumps 18 of chips 60. Substrate 74 can also include additional bumps 78 formed on pads 76 to further enhance connection if so desired and/or appropriate, such as pre-solder bumps for chip-to-laminate-substrate bonding. In addition to force, temperature can be controlled, such as by elevating temperature of WLUF coating 30 to a flow temperature. By continuing to bias article 64 toward assembly 70, solder bumps 18 can be forced through WLUF coating 30 and/or WLUF coating 30 can flow over a surface of substrate 74 to allow solder bumps 18 to move into contact with pads 76, as illustrated in FIGS. 12 and 13. Temperature can further be controlled to cause solder bumps 18 to flow until as much electrical and/or mechanical contact has been achieved therebetween as may be suitable and/or desired, as illustrated in FIG. 14. Typically, this second temperature is higher than the temperature used to flow and/or remove WLUF coating 30, and a cure temperature of WLUF coating 30 can be at the first temperature or between the first and second temperatures. To avoid curing of WLUF coating 30, temperature can be increased or ramped over a relatively short time. Once suitable and/or desired electrical and/or mechanical connection has been achieved, chip 60 and substrate 74 form a packaged device 80 from which bonder head 62 can be removed, as shown in FIG. 15. Packaged device 80 can then be processed as needed prior to shipment.

In embodiments, force and/or temperature used can vary depending on a variety of factors, including die size, the particular material(s) used to form solder bumps 18, WLUF coating 30, and/or pads 76, as well as, where appropriate, bumps 78. For example, for a chip-to-chip bonding arrangement of a device on the order of 650 mm² where solder bumps 18 include a tin-silver (SnAg) solder, corresponding pads 76 include a nickel and gold (Ni/Au) material, the bonding head can be heated to about 150° C., the stage can be heated to about 150° C., and about 450N of force can be applied for about 5 s in a first step to flow and/or remove the WLUF coating, and the head can be heated to 375° C., the stage can be maintained at 150° C., and force can be maintained at 450N for about 15 s in a second step to flow the solder bumps/joining As suggested above, heating to the second temperature can be done at a rate to avoid curing of WLUF coating 30, such as, for example, at a rate of about 50° C./second for the materials and temperatures used in this example, though the rate can differ for other materials and/or combinations of materials and/or other conditions. It should be noted that larger die size (area) can result in greater applied force, and smaller die size (area) can result in lesser applied force. It should also be noted that applied force can vary between steps so that a force of one magnitude can be applied during WLUF coating flow/removal, and a force of another magnitude can be applied during solder flow, again depending on factors such as, but not limited to, die size and materials used and/or properties thereof.

By including WLUF coating 30, solder bumps 18 and attachment surface 15 can be protected from damage and/or chemical reactions that might occur prior to attachment. In addition, WLUF coating 30 can reduce thermal and mechanical stresses induced on chips 60 during attachment, increasing effective fabrication yield and overall quality of product. Further, employing embodiments to enable use of WLUG coating 30 can eliminate flux residue cleaning, baking, and/or plasma capillary underfill flow time.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    selecting a portion of a substantially optically opaque coating to be removed from an attachment surface of a semiconductor device that carries a plurality of solder bumps and at least one feature between two of the plurality of solder bumps, the plurality of solder bumps and the at least one feature being obscured by the substantially optically opaque coating, the obscuring of the at least one feature hindering processing of the semiconductor device;
    removing the selected portion of the coating using laser ablation, thereby exposing a portion of the semiconductor device attachment surface including the at least one feature; and
    cleaning the exposed portion of the semiconductor device and a surrounding surface of the coating.

2. The method of claim 1, wherein the at least one feature between two of the plurality of solder bumps includes an alignment mark, and the selecting a portion includes selecting a region of the surface of the semiconductor device that includes the alignment mark.

3. The method of claim 1, wherein the coating includes a B-staged resin doped with a thermally enhancing filler, the doped resin being substantially optically opaque in a cured state.

4. The method of claim 3, wherein the filler includes fused silica.

5. The method of claim 1, wherein the removing the selected portion using laser ablation includes exposing the selected portion to ultraviolet laser radiation.

6. The method of claim 5, wherein the ultraviolet laser radiation has a wavelength of from about 100 nm to about 400 nm.

7. The method of claim 5, wherein the laser radiation has a fluence of from about 200 mJ/cm² to about 2000 mJ/cm².

8. The method of claim 5, wherein the laser radiation is pulsed at a frequency of from about 100 Hz to about 800 Hz.

9. The method of claim 1, wherein the removing of the selected portion and the cleaning of the exposed semiconductor device surface and surrounding coating surface are performed before dicing of the semiconductor device.

10. The method of claim 1, wherein the removing of the selected portion and the cleaning of the exposed semiconductor device surface and a surrounding coating surface are performed after dicing of the semiconductor device.

11. A preparation method for a semiconductor device having an attachment surface that carries a plurality of solder bumps and at least one attachment alignment mark between two of the plurality of solder bumps, the attachment surface being coated with a substantially optically opaque coating material that obscures the at least one attachment alignment mark, the preparation method comprising:
- selecting a portion of the coating material overlying an attachment alignment mark located between two of the plurality of solder bumps;
- removing the selected portion of the coating material using laser ablation, thereby exposing the respective alignment mark and a respective portion of the attachment surface, including a portion of the attachment surface between the two of the plurality of solder bumps; and
- cleaning the respective portion of the attachment surface and a surrounding surface of the coating material.

12. The method of claim 11, further comprising B-staging the coating material before removing the selected portion.

13. The method of claim 11, further comprising dicing the semiconductor device into singulated chips before the removing of the selected portion.

14. The method of claim 11, further comprising dicing the semiconductor device into singulated chips after the cleaning of the exposed attachment surface.

15. The method of claim 11, wherein the removing of the selected portion using laser ablation includes directing ultraviolet laser radiation at the selected portion.

16. The method of claim 15, wherein the ultraviolet laser radiation has a wavelength of from about 100 nm to about 400 nm.

17. The method of claim 11, wherein the removing of the selected portion using laser ablation includes producing laser radiation with an excimer laser in pulses at a rate of from about 100 Hz to about 500 Hz and a fluence of from about 200 $mJ/cm^2$ to about 1000 $mJ/cm^2$.

18. A method comprising:
- applying a wafer level underfill (WLUF) coating to an attachment surface of a semiconductor device article, the attachment surface including a plurality of solder bumps and a plurality of alignment marks, the coating having a thickness extending beyond an end of a furthest projecting solder bump, thereby obscuring the plurality of alignment marks, including at least one alignment mark located between two of the plurality of solder bumps;
- selecting portions of the WLUF coating corresponding to the obscured plurality of alignment marks including the at least one alignment mark located between the two of the plurality of solder bumps;
- ablating the selected portions of the WLUF coating with a laser ablation system, thereby exposing the obscured plurality of alignment marks including the at least one alignment mark located between the two of the plurality of solder bumps; and
- cleaning the exposed alignment marks and surrounding portions of the attachment surface and the WLUF coating.

19. The method of claim 18, wherein the laser ablation system directs ultraviolet radiation at the selected portions.

20. The method of claim 19, wherein the laser ablation system employs an excimer laser producing ultraviolet radiation pulses at a frequency of from about 100 Hz to about 500 Hz at a fluence of from about 200 $mJ/cm^2$ to about 1000 $mJ/cm^2$ at a wavelength of from about 100 nm to about 400 nm.

* * * * *